US009099532B2

(12) United States Patent
Sel et al.

(10) Patent No.: US 9,099,532 B2
(45) Date of Patent: Aug. 4, 2015

(54) PROCESSES FOR NAND FLASH MEMORY FABRICATION

(71) Applicant: SanDisk Technologies Inc., Plano, TX (US)

(72) Inventors: Jongsun Sel, Los Gatos, CA (US); Tuan Pham, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 35 days.

(21) Appl. No.: 13/775,023

(22) Filed: Feb. 22, 2013

(65) Prior Publication Data

US 2014/0080299 A1    Mar. 20, 2014

Related U.S. Application Data

(60) Provisional application No. 61/701,038, filed on Sep. 14, 2012.

(51) Int. Cl.
| | |
|---|---|
| *H01L 21/768* | (2006.01) |
| *H01L 21/033* | (2006.01) |
| *H01L 27/115* | (2006.01) |
| *H01L 21/28* | (2006.01) |
| *H01L 21/3213* | (2006.01) |

(52) U.S. Cl.
CPC ........ *H01L 21/7682* (2013.01); *H01L 21/0337* (2013.01); *H01L 21/0338* (2013.01); *H01L 21/28273* (2013.01); *H01L 21/32139* (2013.01); *H01L 27/11524* (2013.01); *H01L 27/11519* (2013.01); *H01L 27/11529* (2013.01)

(58) Field of Classification Search
CPC ............ H01L 21/0337; H01L 21/0338; H01L 21/28273; H01L 21/32139; H01L 27/115; H01L 27/11557; H01L 27/11521; H01L 27/11524
USPC .......................... 438/201, 257, 593–594, 258; 257/E21.179, E21.422
See application file for complete search history.

(56) References Cited

U.S. PATENT DOCUMENTS

| | | | |
|---|---|---|---|
| 5,570,315 | A | 10/1996 | Tanaka et al. |
| 5,768,192 | A | 6/1998 | Eitan |
| 5,774,397 | A | 6/1998 | Endoh et al. |
| 6,011,725 | A | 1/2000 | Eitan |
| 6,046,935 | A | 4/2000 | Takeuchi et al. |
| 6,894,341 | B2 | 5/2005 | Sugimae et al. |
| 7,495,294 | B2 | 2/2009 | Higashitani |
| 7,985,682 | B2 | 7/2011 | Matsuzaki |

(Continued)

OTHER PUBLICATIONS

Notification of Transmittal of the International Searching Report and the written Opinion of the International Searching Authority for Int'l Application No. PCT/US2013/058314, mailed Jun. 3, 2014, 17 pages.

(Continued)

*Primary Examiner* — Thanhha Pham
(74) *Attorney, Agent, or Firm* — Davis Wright Tremaine LLP

(57) ABSTRACT

Narrow word lines are formed in a NAND flash memory array using a double patterning process in which sidewall spacers define word lines. Sidewall spacers also define edges of select gates so that spacing between a select gate and the closest word line is equal to spacing between adjacent word lines.

8 Claims, 18 Drawing Sheets

(56) References Cited

U.S. PATENT DOCUMENTS

| | | |
|---|---|---|
| 8,158,333 B2 | 4/2012 | Hashimoto |
| 8,194,470 B2 | 6/2012 | Higashitani |
| 8,227,354 B2 * | 7/2012 | Kim et al. ............. 438/717 |
| 2010/0155813 A1 | 6/2010 | Murata et al. |
| 2010/0173492 A1 | 7/2010 | Kim et al. |
| 2012/0168841 A1 | 7/2012 | Chen et al. |
| 2012/0208361 A1 | 8/2012 | Ha |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Invitation to Pay Additional Fees and, Where Application, Protest Fees ; Communication relating to the Results of the Partial International Search, Int'l Appl. No. PCT/US2013/058314, mailed Feb. 27, 2014, 6 pages.

* cited by examiner (Section A-A)

- GC PEP GC Mask (WL + SG)
- GC SAG TEOS RIE(Insitu- Ashing)/SH
- GC Slimming WET(BHF170U APC +IPA dryer)
- GC Spacer SiN 20nm
- GC Spacer SiN RIE
- GC Spacer SiN Asher
- GC Spacer SiN SH
- Spin on Coating CTL53 200nm
- CTL Etch back on the top of SiN spacer
- GC SAG TEOS WET
- AG formation P SiH4 70nm
- Refill P- SiN 50nm
- Refill P- SiN Etch back on AG-PSiH4
- AG P- SiH4 Etch Back on the top of SiN spacer
- WET P- SiH4(Removal remaining AG-P SiH4)
- Peri Gate SMAP MAE SH
- Skip: SG SMAP Coat SMAP BtmLayer Coat
- Peri Gate PEP Peri Gate Mask(KrF)
- GC Mask aSi RIE
- Peri Gate Asher/SH
- Strip P- SiN (Skip or apply)

*FIG. 1D*

- GC aSi Mask (Non-doped)
- GC 2$^{nd}$ aSi Mask
- SAC-TEOS
- T-SiN
- SOC/SOG coating
- GC PEP & SOC/SOG RIE
- Slimming SOC and SOG
- Spacer ULT SiO$_2$     WET
- RIE Spacer ULT SiO$_2$ (Skip Asher)
- GR PEP (MUV)
- GR WET & SH
- T- SiN RIE
- Inversion aSi
- Inversion aSi RIE
- Transfer SiN Strip
- AG 80nm(P- SiH4 ord- TEOS)
- KG PEP
- AG RIE and WET
- SAC- TEOS RIE & SH
- Slimming WET
- Spacer SiN
- Spacer SiN RIE and Asher
- SAC- TEOS Half WET
- GP PEP (ArF) / SMAP RIE
- GP SAC-TEOS WET
- GP SH
- GR PEP (KrF)
- GR RIE & SH
- GC Mask aSi RIE

*FIG. 12*

Cell Array          Peri. Gate

Cell Array          Peri. Gate

Cell Array          Peri. Gate

Cell Array          Peri. Gate

Cell Array    Peri. Gate

Cell Array    Peri. Gate

SG PEP and RIE

PROCESSES FOR NAND FLASH MEMORY FABRICATION

This application claims the benefit of U.S. Provisional Patent Application No. 61/701,038, filed on Sep. 14, 2012.

BACKGROUND

This invention relates generally to non-volatile semiconductor memories of the flash EEPROM (Electrically Erasable and Programmable Read Only Memory) type, their formation, structure and use, and specifically to methods of making NAND memory cell arrays.

There are many commercially successful non-volatile memory products being used today, particularly in the form of small form factor cards, which use an array of flash EEPROM cells. An example of a flash memory system is shown in FIG. 1A, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 1B. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 1C, a cross-section along line A-A of FIG. 1B). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 1C. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Certain methods of making flash memory arrays allow patterning of extremely small features. These features may be smaller than the minimum feature size achievable using direct patterning lithography. For example, word lines in a NAND flash memory array may have a width less than the minimum feature size achievable using direct pattern lithography. Integrating such methods with more conventional methods presents challenges. It is generally desirable to form extremely small features and somewhat larger features, which may be formed by direct pattern lithography, together in an efficient manner without unnecessary process steps.

SUMMARY

A method of forming a NAND flash memory uses double patterning with sidewall spacers so that word lines are formed that have a width that is smaller than the minimum feature size achievable using direct patterning photolithography. Larger select lines are formed with at least one edge defined by a sidewall so that a space between such select lines and the closest word line may be smaller than the minimum feature size and may be equal to the space between word lines. Thus, extremely small structures and somewhat larger structures can be formed using a common process. Regular spacing improves uniformity, for example, when etching.

An example of a method of forming a NAND flash memory includes: forming a plurality of structures using a photolithographic process; forming a plurality of sidewall spacers having a lateral dimension that is less than the minimum resolvable dimension of the photolithographic process, sidewall spacers spaced apart a distance that is less than the minimum resolvable dimension of the photolithographic process, the plurality of sidewall spacers formed along sides of the plurality of structures; forming a plurality of word lines according to the plurality of sidewall spacers; and forming a select line such that at least one edge of the select line is defined by an individual sidewall spacer that is spaced apart from its closest neighbor a distance that is less than the minimum resolvable dimension of the photolithographic process.

The individual sidewall spacer may enclose an area that defines the select line and dimensions of the area may exceed the minimum resolvable dimension of the photolithographic process. An air gap layer may be formed over the plurality of sidewall spacers prior to the formation of the plurality of word lines and prior to the formation of the select line. The air gap layer may extend downwards into the area enclosed by the individual sidewall spacer and may not extend downwards between sidewall spacers that define word lines, and may not extend downwards between the individual sidewall spacer and sidewall spacers used to define word lines. The lateral dimension of the sidewall spacers may be half the minimum resolvable dimension of the photolithographic process and sidewall spacers used to form word lines may be spaced apart a distance that is half the minimum resolvable dimension of the photolithographic process.

An example of a method of forming a NAND flash memory array includes: forming a plurality of structures using a photolithographic process; subsequently, slimming the plurality of structures so that at least one dimension is less than the minimum resolvable dimension of the photolithographic process; subsequently, forming a plurality of sidewall spacers defined by the slimmed plurality of structures, the sidewall spacers having a lateral dimension that is less than the minimum resolvable dimension of the photolithographic process; subsequently, forming an air gap layer, the air gap layer overlying air gaps between first sidewall spacers in word line areas and the air gap layer extending between second sidewall spacers in select line areas in select line areas; subsequently, etching back the air gap layer to remove the air gap layer over the first sidewall spacers and the air gaps while leaving at least a portion of the air gap layer between the second sidewall spacers; subsequently, forming word lines defined by the first sidewall spacers; and forming select lines with edges defined by the second sidewall spacers.

The sidewall spacers may be formed of Silicon Nitride. The air gap layer may be formed of Silicon dioxide using Silane (SiH4). A layer of Silicon Nitride may be formed on the air gap layer. The layer of Silicon Nitride may be etched back with the air gap layer such that portions of the Silicon Nitride layer remain in the select line areas.

An example of a method of forming a NAND flash memory includes: forming a plurality of structures using a photolithographic process; forming a plurality of sidewall spacers having a lateral dimension that is less than the minimum resolvable dimension of the photolithographic process, individual sidewall spacers spaced apart from each other by a distance that is less than the minimum resolvable dimension of the photolithographic process, an individual sidewall spacer formed as a continuous loop along sides of a structure; and cutting the plurality of sidewall spacers by wet etching with at least one etch mask opening that extends across portions of each of the plurality of sidewall spacers.

The plurality of sidewall spacers may be additionally cut by a reactive ion etching step with a plurality of etch mask openings. The reactive ion etching step may additionally divide select line structures into individual select lines. The plurality of sidewall spacers may be cut by the wet etching at a first end and the plurality of sidewall spacers may be additionally cut by the reactive ion etching step at a second end. Contact pads may be formed at the second end. Word lines may be formed in a pattern established by the plurality of sidewall spacers.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF ILLUSTRATED EMBODIMENTS

FIG. 1A shows a nonvolatile memory system.
FIG. 1B shows a NAND flash memory array in plan view.
FIG. 1C shows a NAND flash memory array in cross section along a NAND string.
FIG. 1D shows an example of a process flow for forming a NAND flash memory array.
FIG. 2 shows a cross section of a NAND flash memory array and peripheral area at an intermediate stage of fabrication including sidewall spacers.
FIG. 3 shows the structure of FIG. 2 after deposition of CTL material.
FIG. 4 shows the structure of FIG. 3 after removal of sacrificial structures.
FIG. 5 shows the structure of FIG. 4 after formation of an airgap layer.
FIG. 6 shows the structure of FIG. 5 after etchback.
FIG. 7 shows the structure of FIG. 6 after further etchback.
FIG. 8 shows the structure of FIG. 7 after wet etching.
FIG. 9 shows the structure of FIG. 8 after removal of CTL material.
FIG. 10 shows the structure of FIG. 9 after patterning in the peripheral area.
FIG. 11 shows the structure of FIG. 10 after an etch step.
FIG. 12 is another example of a process flow for forming a NAND flash memory array.
FIG. 13 shows a cross section of a NAND flash memory and peripheral area at an intermediate stage of fabrication.
FIG. 14 shows the structure of FIG. 13 with a photoresist mask.
FIG. 15 shows the structure of FIG. 14 after transfer of the mask pattern.
FIG. 16 shows the structure of FIG. 15 after slimming of patterned structures.
FIG. 17 shows the structure of FIG. 16 after deposition of a thin blanket layer.
FIG. 18 shows the structure of FIG. 17 after anisotropic etching.
FIG. 19 shows the structure of FIG. 18 after removal of material to leave sidewall spacers.
FIG. 20 shows the structure of FIG. 19 after transfer of the sidewall spacer pattern.
FIG. 21 shows the structure of FIG. 20 after formation of an airgap layer.
FIG. 22 shows the structure of FIG. 21 with a photoresist mask added.
FIG. 23 shows the structure of FIG. 22 after etching the airgap layer.
FIG. 24 shows the structure of FIG. 23 after pattern transfer.
FIG. 25 shows the structure of FIG. 24 after formation of word lines and a second airgap layer.
FIG. 26 shows a portion of a NAND memory array at an intermediate stage of fabrication including a plurality of closed loops of masking material.
FIG. 27 shows an etch step that combines cutting closed loops and separating select gates.

DETAILED DESCRIPTION

The present application relates to the formation of NAND flash memory circuits having certain features and to methods of forming such NAND flash memory circuits in an efficient manner that uses a small number of process steps. Two exemplary process flows are shown in the attached Figures. A first process flow is summarized in FIG. 1D and is shown in detail in FIGS. 2-11. A second process flow is summarized in FIG. 12 and is illustrated in detail in FIGS. 13-26.

One important feature of both process flows is that the gap between a select line and the word line that is closest to the select line is the same size as the gap between word lines. This spacing can be seen, for example, in FIG. 11, which shows a mask pattern that is used for control gate (GC) patterning (and for select gate patterning). It can be seen that the space between each word line mask portion "WL MASK" and adjacent word line mask portion is F/2, where F is the minimum feature size achievable using direct patterning photolithography. (The spacing F/2 is achieved using a double patterning technique which takes structures formed by direct patterning phothlithography patterning, with minimum feature size F, and uses slimming and sidewall spacers to create smaller features as described in more detail below.) In FIG. 11 the distance between the select gate mask portion "SG MASK" and the closest word line mask portion is also F/2. Many prior NAND flash memories have a spacing of F, or more than F, between the select line and the closest word line even where spacing between word lines is F/2. Achieving a uniform spacing of F/2 avoids certain problems when etching to form these gaps since non-uniform spaces tend to provide non-uniform etch rates. Thus, wider gaps may be over-etched compared with smaller gaps, leading to "gouging" of Silicon in the wider gaps between select lines and word lines.
Process 1 (FIGS. 1-11)

FIG. 1D is a summary of a process used to obtain F/2 spacing between a select line and the closest word line. Certain terms are abbreviated according to the following glossary: GC=Control gate, PEP=Photo Engraving Process, AG=Air Gap, SG=Select Gate, WL=Word line, RIE=Reactive Ion Etch, SAC=Sacrificial. Other terms follow accepted chemical terminology, e.g. SiN=Silicon Nitride, IPA=Isopropyl Alcohol, etc.

FIG. 2 shows a cross section of a NAND flash memory chip at an intermediate stage of fabrication. SiN spacers 201 are formed by a sidewall process along the sides of TEOS structures 203 in what later becomes the active area of the memory chip (i.e. this is where NAND strings form a flash memory array). On the right hand side a portion of a peripheral circuit 205 is shown where a gate of a transistor is later to be formed (marked "Peri. Gate"). Details of process steps that may be used to form such sidewall spacers are provided in the second process below.

Under the SiN spacers 201 and TEOS structures 203 is a stack of layers that include layers used to form the memory array. These include an undoped amorphous Silicon layer 207 (e.g. 120 nm thick), a TEOS (or BSG) layer 209 (e.g. 120 nm), cap Silicon Nitride layer 211 (e.g. 10 nm), Tungsten Nitride/Tungsten (WN/W) layer 213 (e.g. 5 nm/50 nm), control gate (word line) layer 215 (e.g. 40 nm doped polysilicon), inter poly dielectric (IPD) layer 217, floating gate layer 219 (e.g. 70 nm doped polysilicon), and gate dielectric layer 221. In other examples a different stack of layers may be used and/or the dimensions may be different.

FIG. 3 shows the structure of FIG. 1 after deposition and etch back of an Anti-Reflection Layer (ARL, or "CTL") material 231. This material fills gaps between sidewall spacers 201 and may be etched back to form the planarized structure shown.

FIG. 4 shows the structure of FIG. 3 after a wet etch is used to remove sacrificial TEOS structures 203, leaving SiN sidewall spacers 201 and CTL portions 231. While CTL fills some gaps between SiN sidewall spacers 201 at this point, gaps where TEOS structures 203 were removed are air-filled at this point. TEOS is also removed in the peripheral area 205. It will be understood that TEOS refers to Silicon Dioxide material formed by deposition using TEOS.

FIG. 5 shows the structure of FIG. 4 after deposition of a two-layer structure to fill large gaps where sacrificial TEOS structures 203 were removed. In particular, a 70 nm layer 251 of Silicon Dioxide (SiO2) is formed using SiH4, followed by a 50 nm layer 253 of SiN. The SiO2 is formed on the SiN sidewall spacer pattern with deposition occurring on the tops of SiN spacers 201, but little or no deposition on sides of sidewall spacers 201. Thus, mushroom-like growth occurs at the tops of gaps thereby sealing off gaps at the top without filling the gaps. These gaps remain from SiN refill. They are filled with air at this point and may be referred to as airgaps. The layer used to extend over the gaps, enclosing air in the gaps, may be referred to as an "airgap layer" abbreviated to "AG." Airgaps 255 are shown in alternating spaces between sidewall spacers 201 at this point. An alternative airgap layer may be formed of Silicon Dioxide using TEOS.

FIG. 6 shows the structure of FIG. 5 after etching back the SiN layer 253 where it overlies the AG layer 251, leaving a generally planarized structure with SiN 253 remaining only in large gaps where select lines are to be formed. All SiN is removed from the peripheral gate area 205 at this point.

FIG. 7 shows the structure of FIG. 6 after etching back the airgap layer 251 to expose the airgaps 255 between sidewall spacers and to expose CTL portions 231. At this point, gaps between sidewall spacers alternate between being air filled and being filled with CTL. All AG material 251 is removed from the peripheral gate area 205 at this point.

Figure 1A:
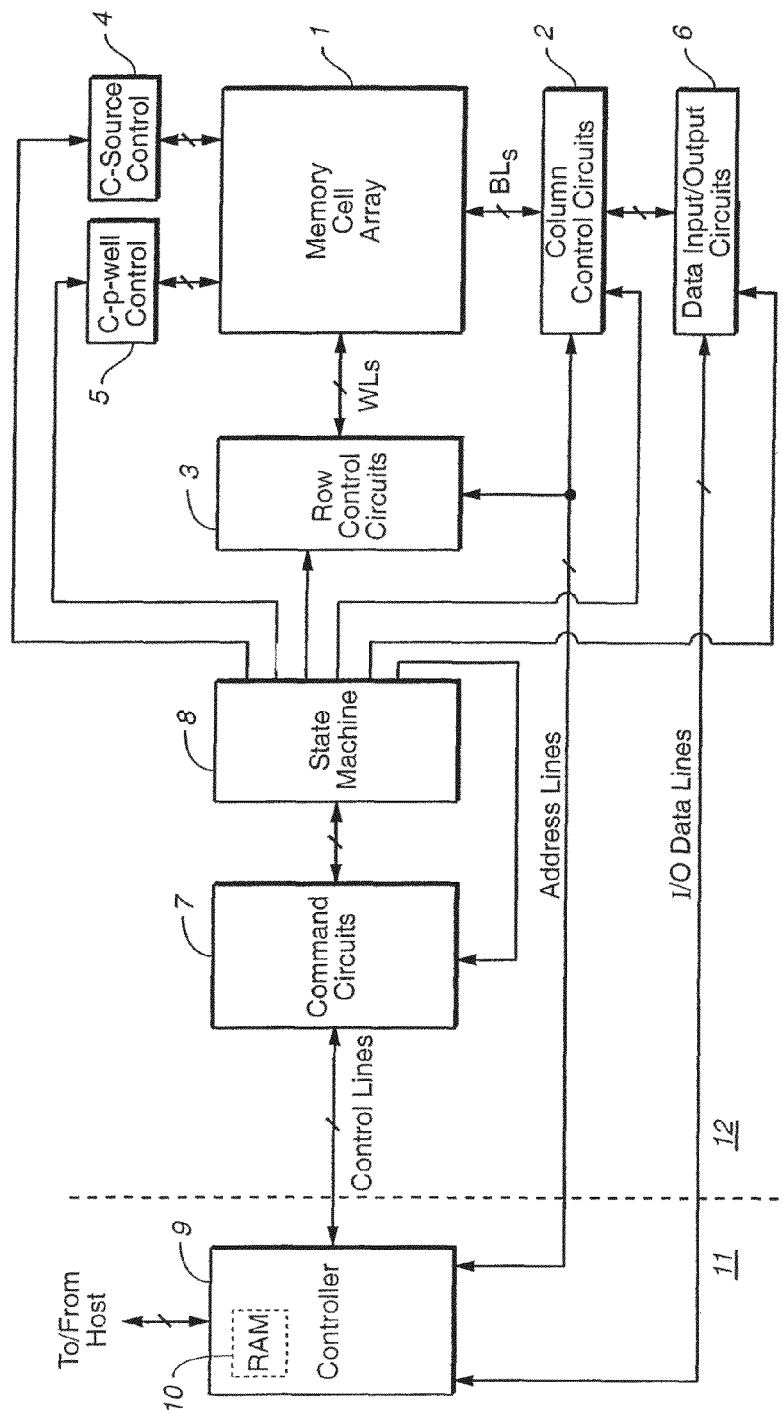
Figure 1B:
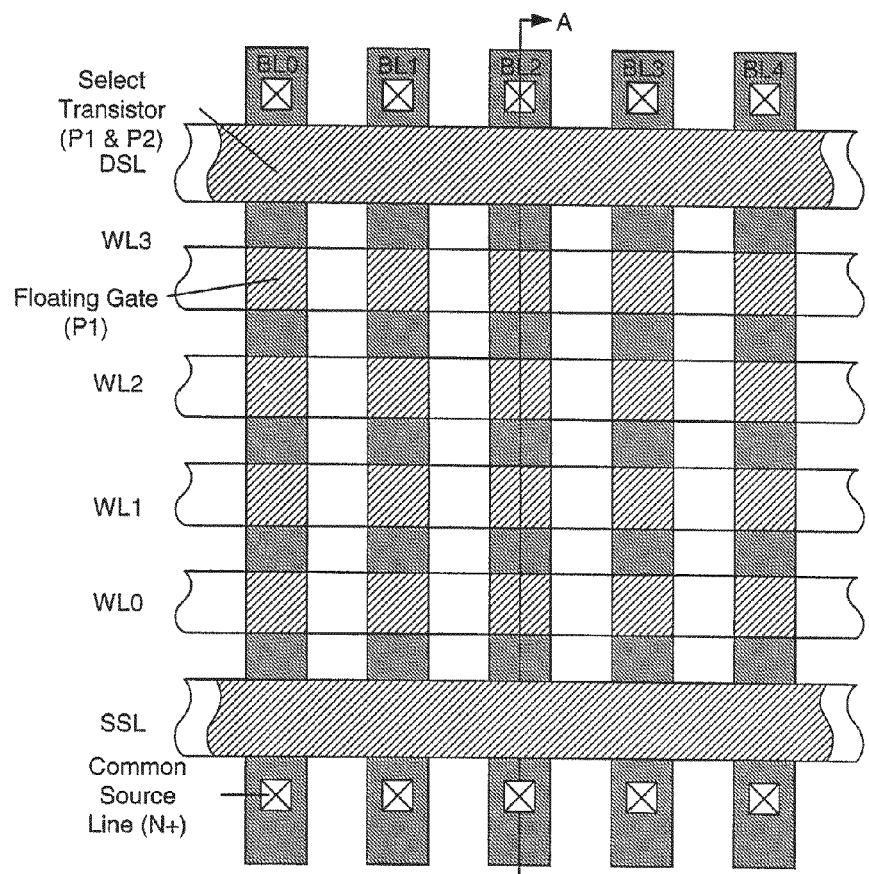
Figure 1C:
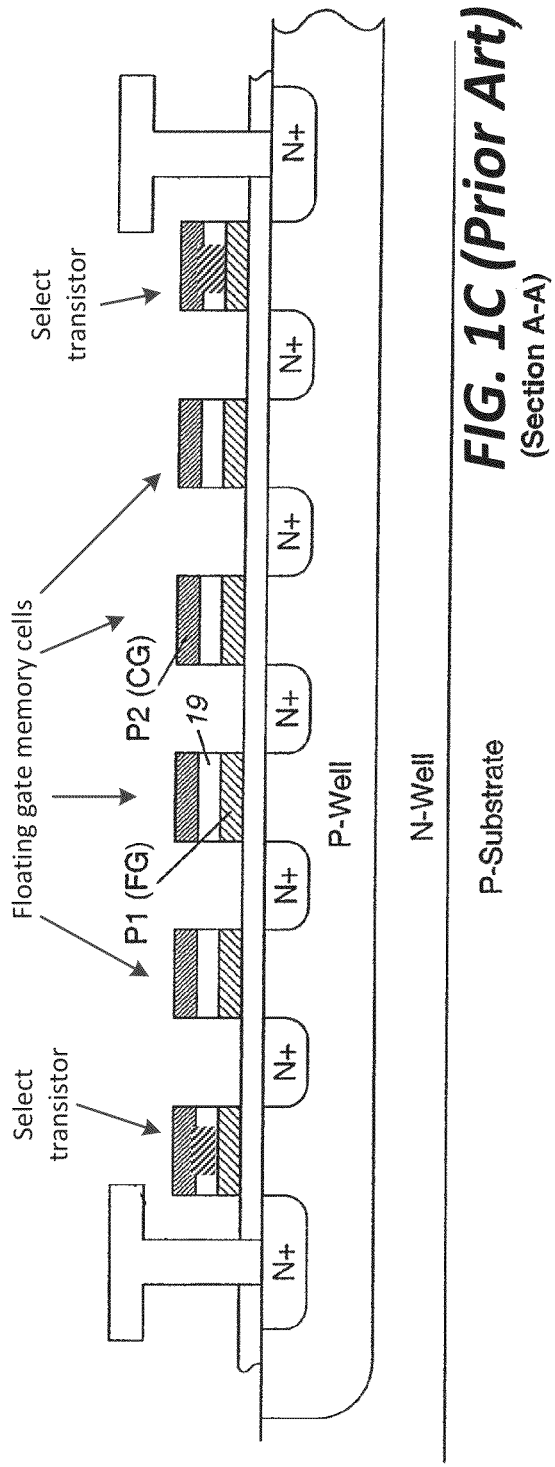
Figure 2:
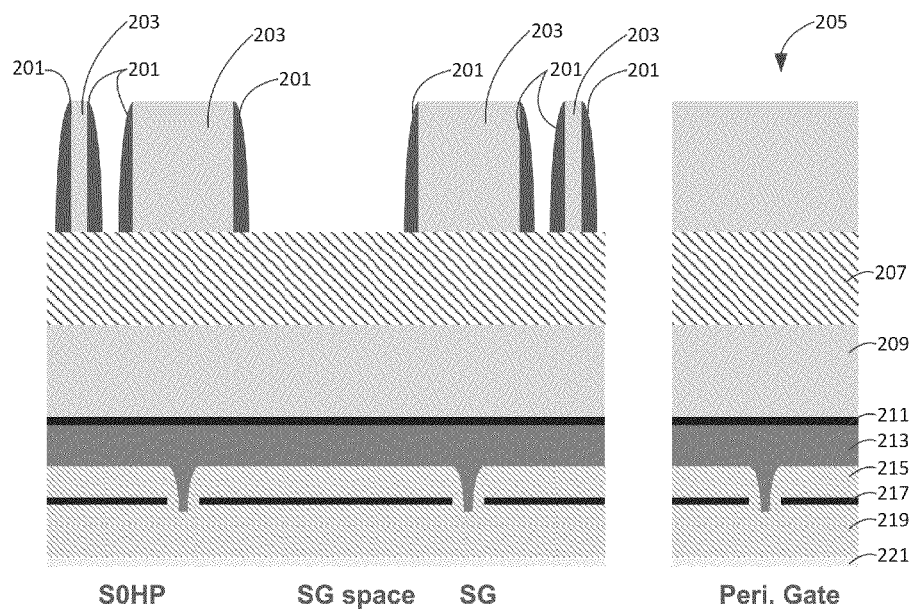
Figure 3:
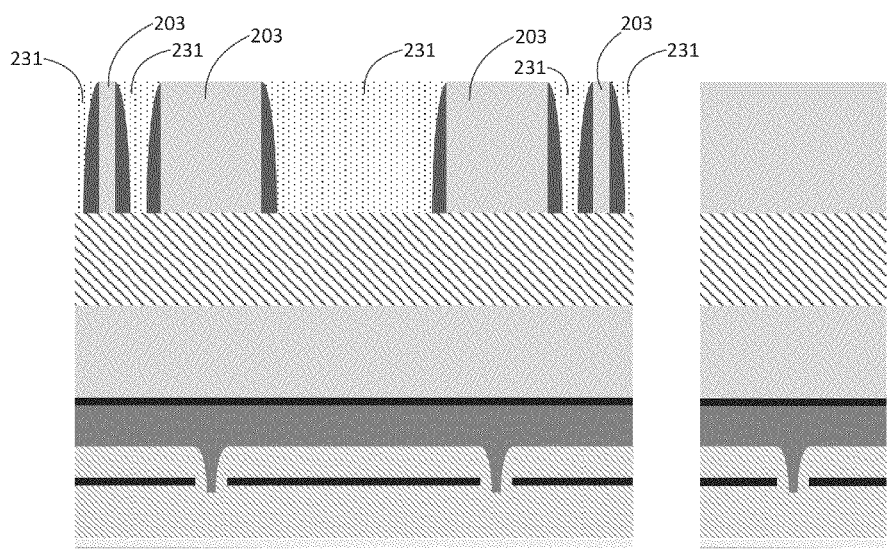
Figure 4:
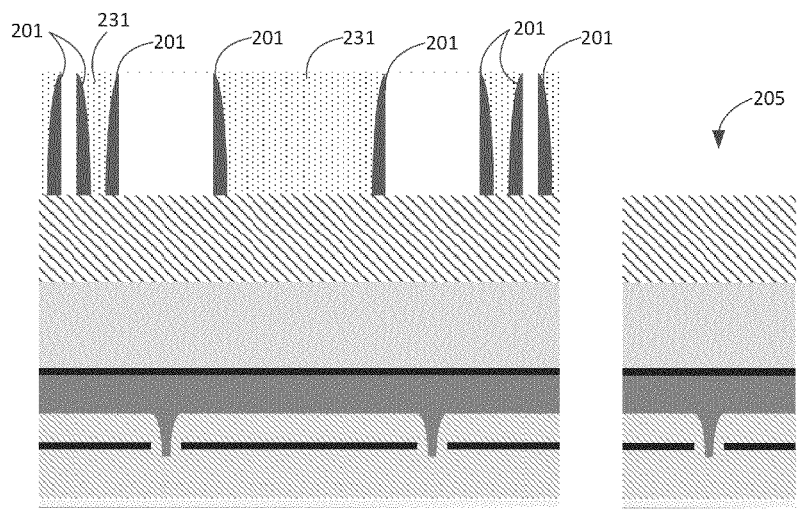
Figure 5:
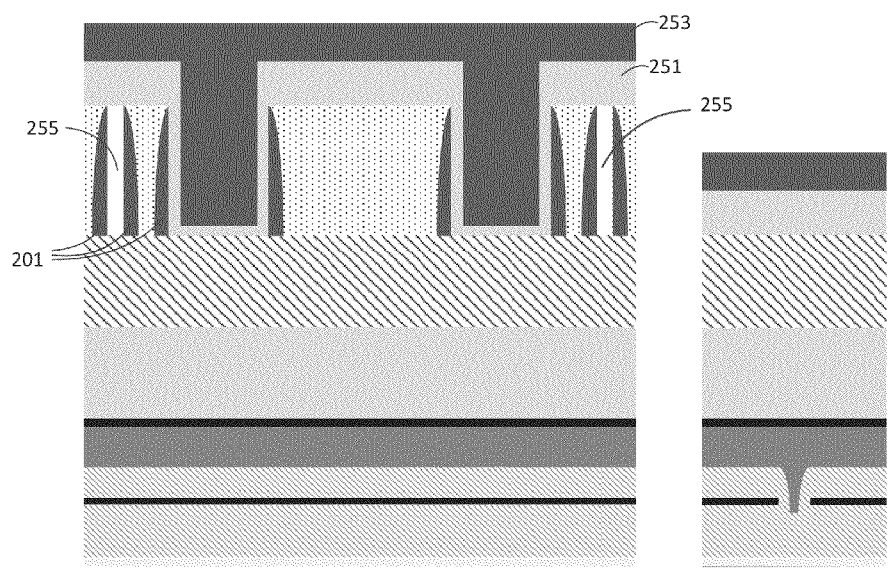
Figure 6:
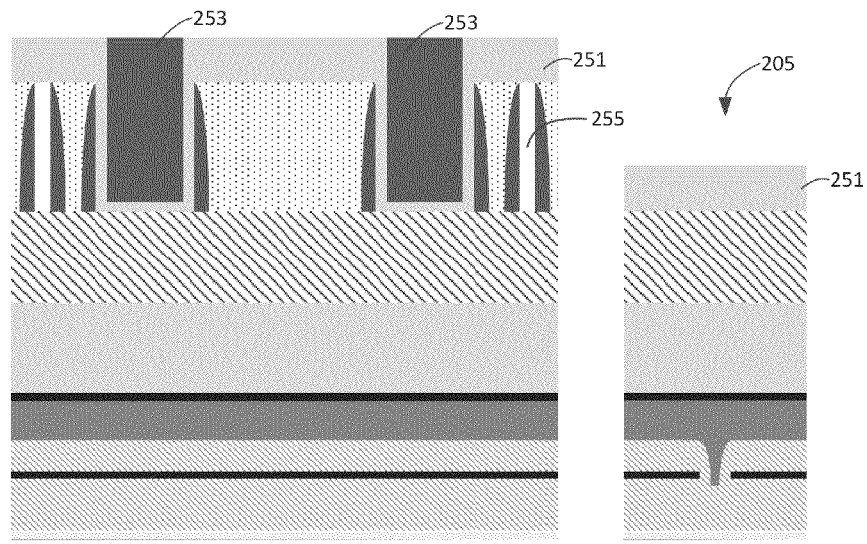
Figure 7:
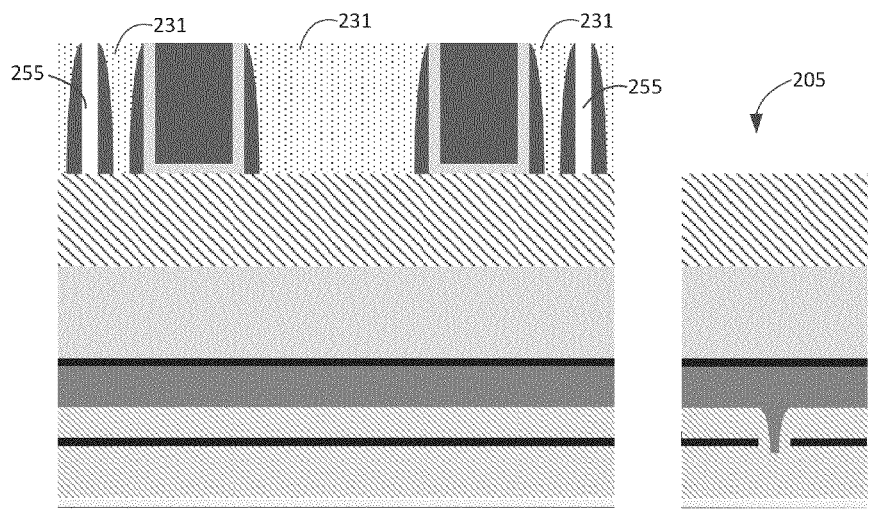
Figure 8:
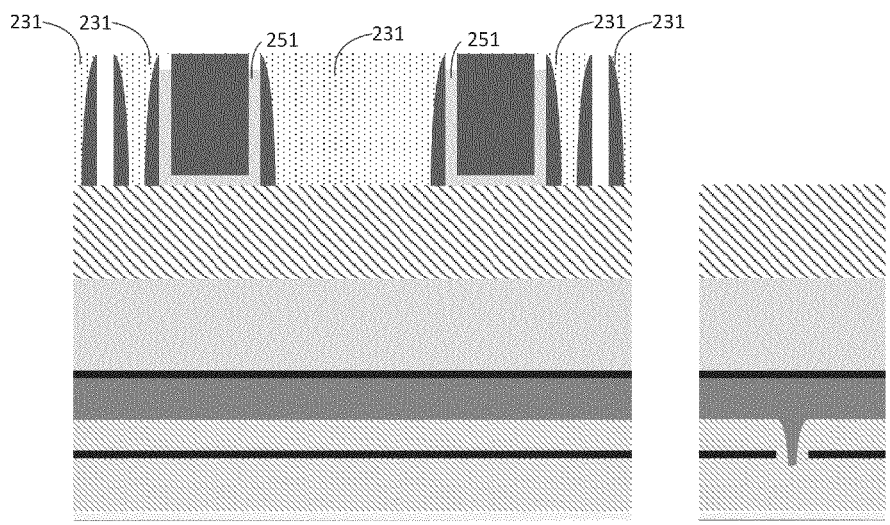
FIG. 8 shows the structure of FIG. 7 after etch back of remaining AG material 251.
Figure 9:
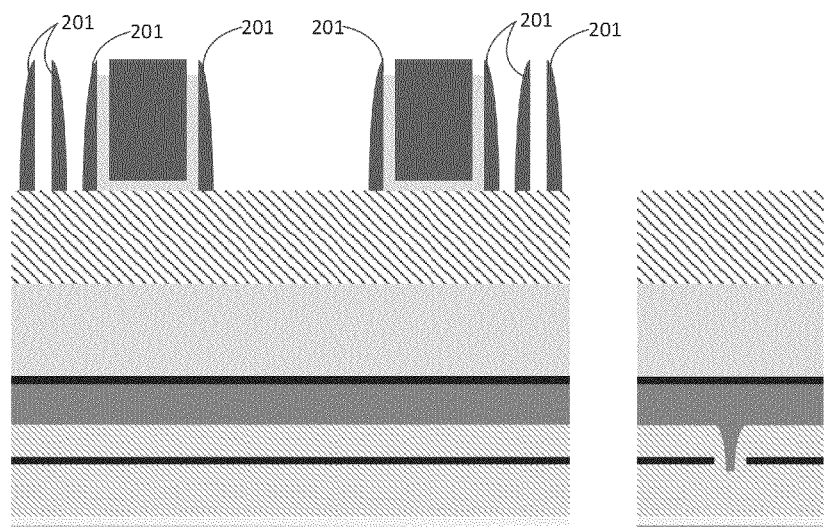
FIG. 9 shows the structure of FIG. 8 after removal of CTL material 231 leaving only air between sidewall spacers 201. This process step may include ashing to remove photoresist and/or CTL and/or other unwanted material.
Figure 10:
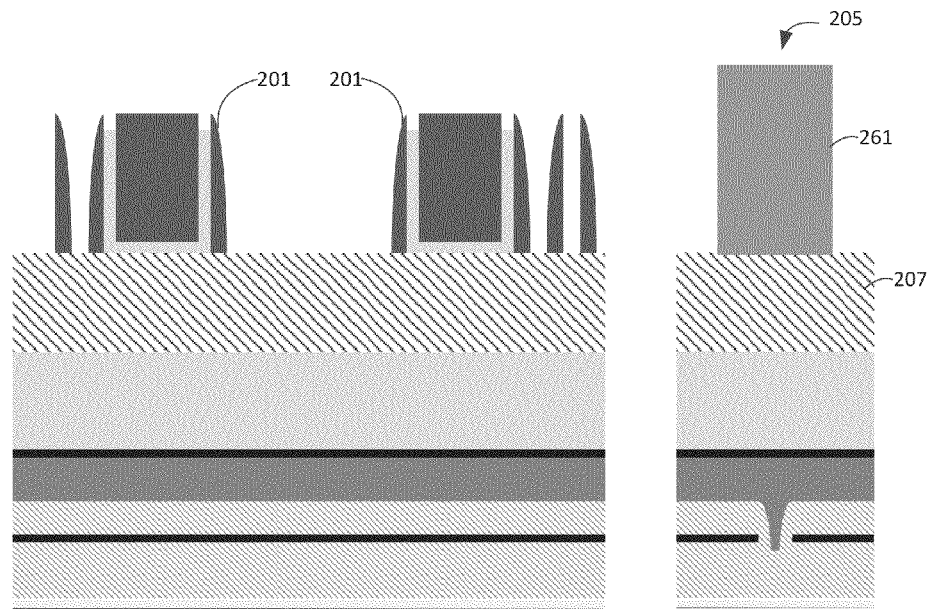
FIG. 10 shows the structure of FIG. 9 after patterning (PEP) to form a photoresist mask portion 261 in the peripheral area 205 where a gate is to be formed. In this case a KrF photoresist is used.
Figure 11:
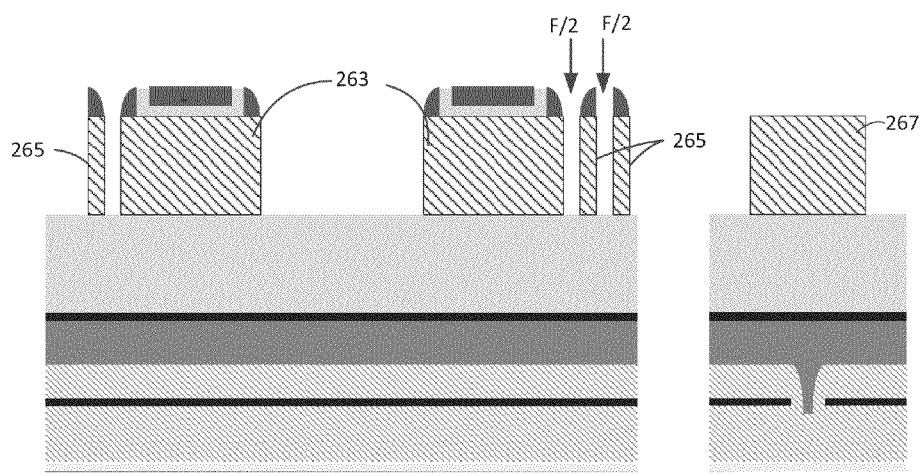

FIG. 11 shows the structure of FIG. 10 after an etch step that etches the underlying amorphous Silicon ("aSi") layer 207 that is under the sidewall spacers 201 (and under KrF photoresist 261 in peripheral area 205). This transfers the pattern above to the amorphous Silicon 201 which is then used to pattern the underlying layers to form word lines and select lines. It can be seen that the mask portions 263 that define select gates and the mask portions 265 that define word lines ("WL MASK") are spaced apart by a distance F/2 that is the same as the distance between individual word line mask portions. Thus, when etching to form separate word lines and select lines, each gap is the same size so that overetching and gouging of the substrate is avoided. The dimensions and locations of mask portions 263 (and hence dimensions and locations of select lines) are defined by sidewall spacers 201. Similarly, the dimensions and locations of mask portions 265 (and hence dimensions and locations of word lines) are defined by sidewall spacers 201. Thus, both extremely small and somewhat larger features are defined by a common patterning process that has a very small resolution. The dimensions of the masking portions 267 in peripheral area 205, and spacing between such portions in the peripheral area, is determined by photolithography and is generally larger than in the memory array, typically greater than F.
Process 2 (FIGS. 12-26)

FIG. 12 is a summary of the process that is described in detail in FIGS. 13-26. The same abbreviations are used in FIG. 12 as in earlier figures.

Figure 13:
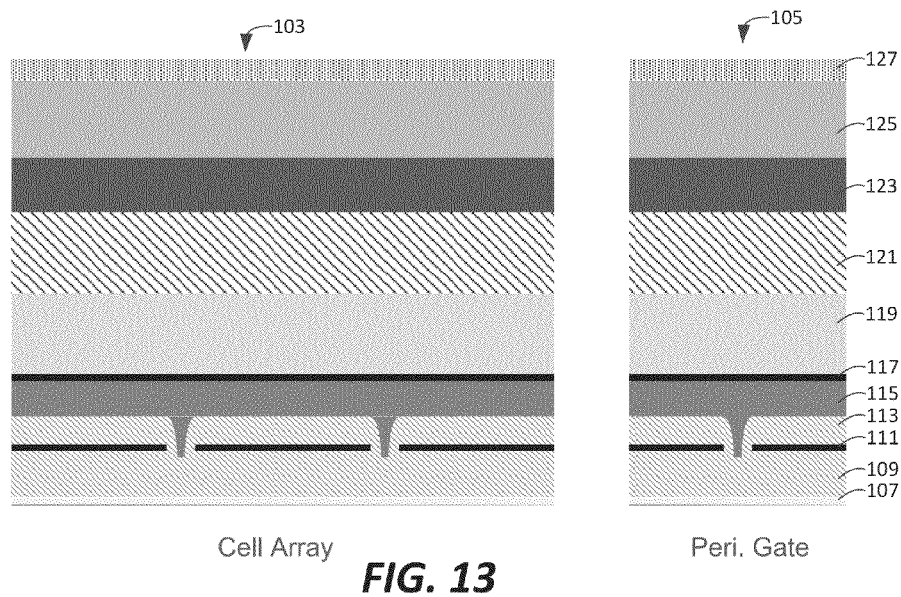

FIG. 13 shows a portion of a cell array area 103 and a peripheral gate area 105 on a Silicon substrate. The cell array area 103 corresponds to the active area where NAND strings are to be formed and the peripheral gate area 105 corresponds to an area in the periphery where the gate of a transistor is to be formed. A stack of layers extends across the substrate at this point and these layers are used to pattern and form word lines (and underlying floating gates) and select lines as will be described in more detail here. Overlying the substrate is a gate dielectric 107, a floating gate layer 109, an inter poly dielectric 111, control gate (word line) polysilicon layer 113, Tungsten Nitride/Tungsten layer 115, cap SiN 117, TEOS 119, amorphous Silicon 121, SiN 123, spin-on Carbon (SOC) 125, and spin-on glass (SOG) 127.

Figure 14:
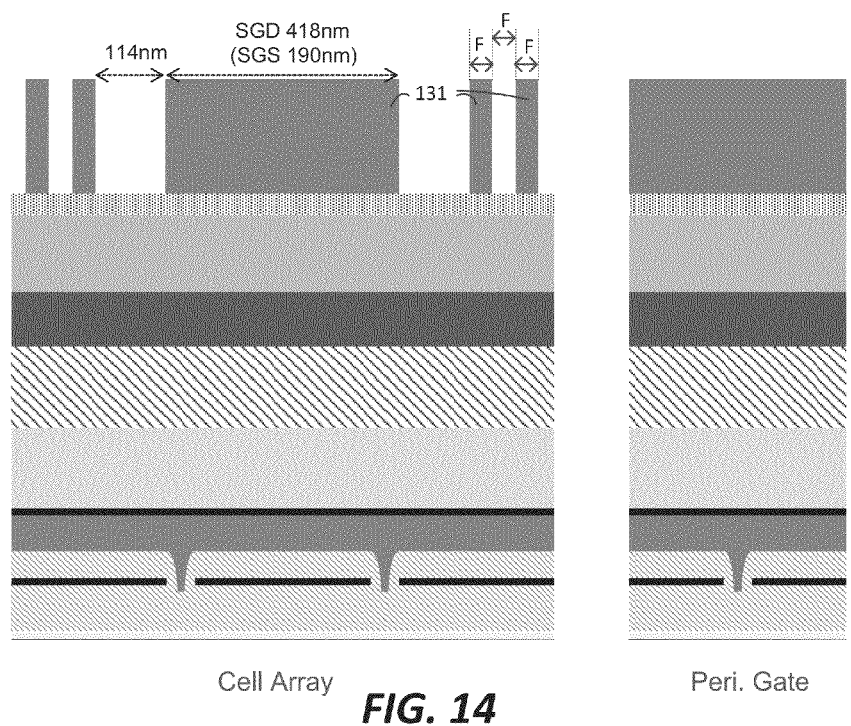

FIG. 14 shows the structure of FIG. 13 after a photoresist layer is deposited (spun on) and patterned by photolithography to form structures 131 extending perpendicular to the plane of the cross section shown. The spacing between structures may be the minimum feature size of the photolithographic process, F, and the structures themselves may have a width F as shown. Gaps adjacent to the large mask portion in the middle of the cell area are larger than F. In the example shown these gaps are 114 nm wide. The central structure is used to form select gate structures and may have dimensions in the range shown (418 nm for drain side select gate, and 190 for source side select gate).

Figure 15:
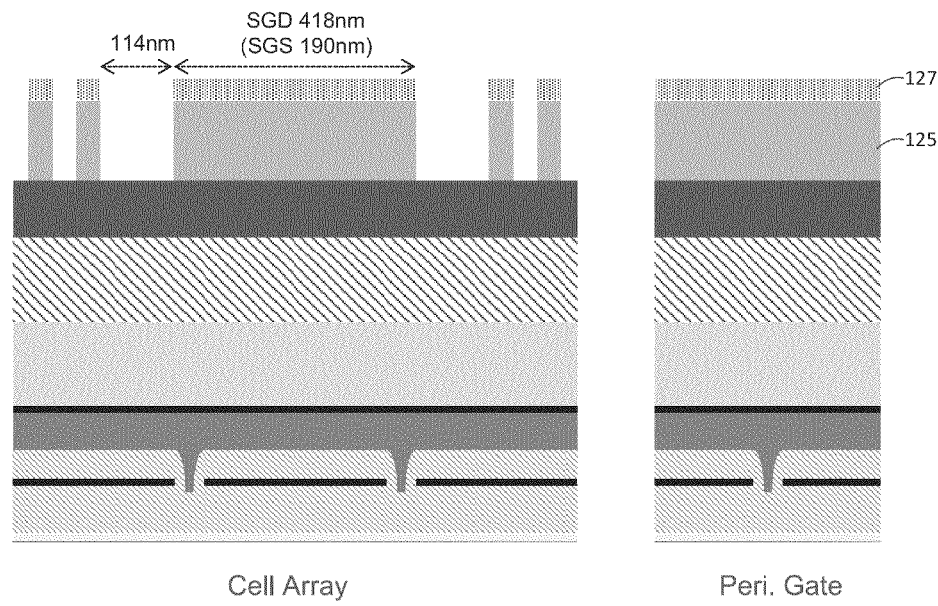

FIG. 15 shows the structure of FIG. 14 after the photoresist pattern is transferred to the underlying layers of SOC 125 and SOG 127 by etching (by RIE) using the photoresist mask structures 131. The SOG (spin-on glass) and SOC (spin-on Carbon) layers thus have structures with the same spacing as the photoresist structures of FIG. 14.

Figure 16:
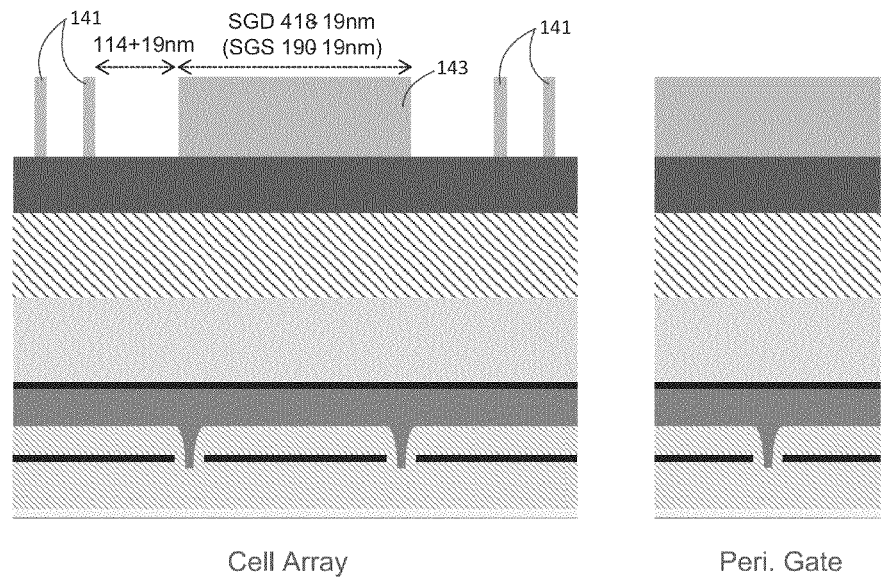

FIG. 16 shows the structure of FIG. 15 after a slimming step that reduces the lateral dimensions of the SOC structures 141. A wet etch may be used to remove all SOG and some SOC material so that these structures are slimmed (and gaps grow accordingly). In the example shown, structures 141 are slimmed by about 19 nm, and gaps grow by about 19 nm, resulting in gaps adjacent to the large SOC structure 143 of approximately 114+19=133 nm.

Figure 17:
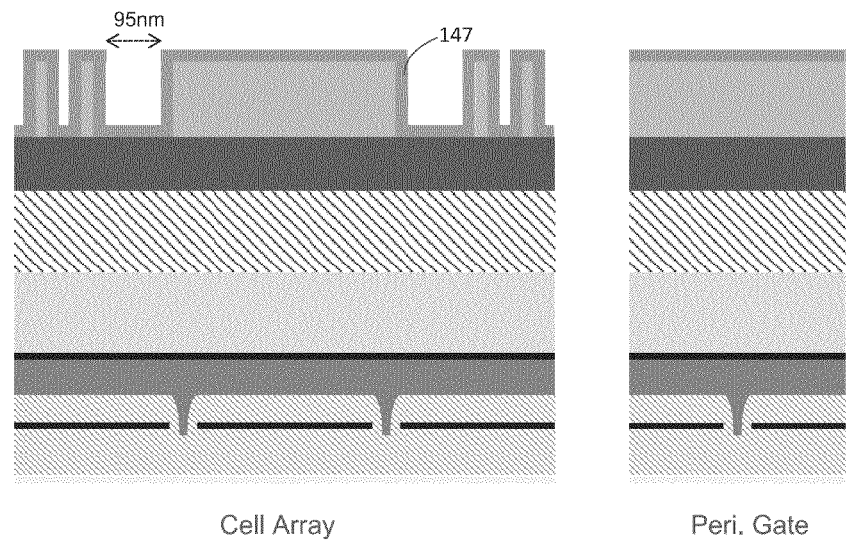

FIG. 17 shows the structure of FIG. 16 after deposition of a spacer Silicon Dioxide (SiO2) blanket layer 147 using an Ultra Low Temperature (ULT) process. This layer is approximately 16 nm thick and thus reduces the gaps on either side of the large SOC structure to approximately 95 nm (reduced by approximately 38 nm).

Figure 18:
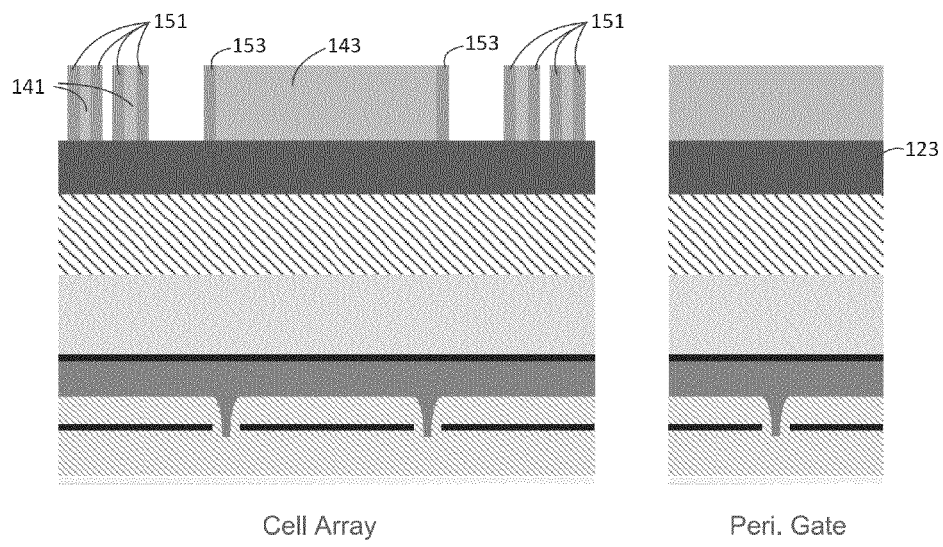

FIG. 18 shows the structure of FIG. 17 after an anisotropic (e.g. RIE) etch step to remove portions of the spacer SiO2 layer 147 that extend laterally over SOC or over underlying SiN 123, so that the spacer SiO2 only remains along sidewalls of the slimmed SOC structures 141, 143. These sidewall spacers 151 have lateral dimensions that are approximately F/2 and are spaced apart approximately F/2 and may be used as mask portions to pattern word lines. Additional sidewall spacers 153 are located where select lines are to be formed.

Because sidewall spacers are formed around sidewalls of structures they form continuous closed loops. Conductive material patterned using such loops may form conductive loops. These may be operated as loops that include two word lines, or may be cut into portions that are separately controlled as separate word lines. Cutting may occur at some suitable stage of fabrication but in some cases such cutting causes unwanted effects and adds to the complexity of processing. In an example process step, portions of sidewall spacers 151 are removed from part of the loop at this point in the process, this serves to prevent formation of conductive closed loops. Instead, the openings in the mask portions are reproduced in the underlying conductive material. In some process flows patterning and etching steps may be performed at this point in order to cut loops at one or both ends. Such a process will be described in more detail later.

Figure 19:
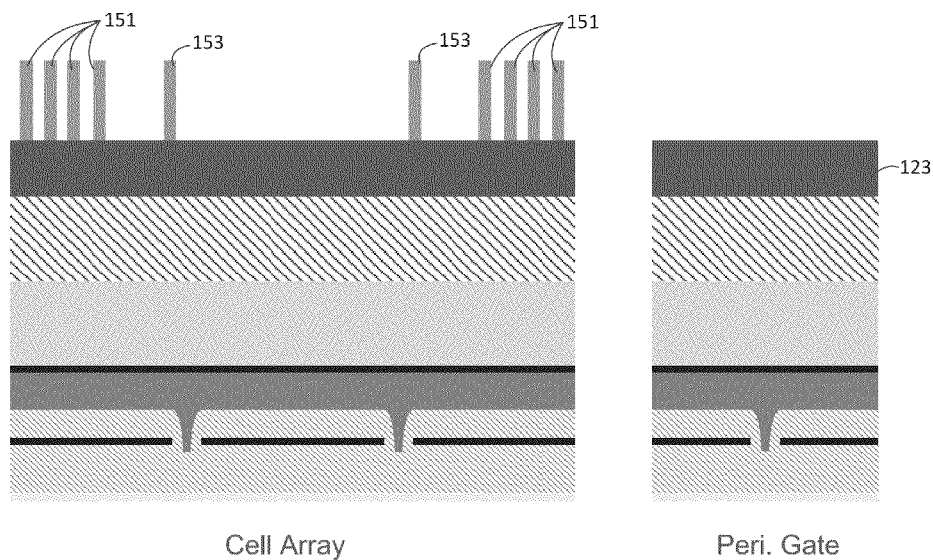

FIG. 19 shows the structure of FIG. 18 after removal of SOC material, leaving sidewall spacers 151 where word lines are to be formed and sidewall spacers 153 where select lines are to be formed. Sidewall spacers may be continuous closed loops at this point, or may have at least one cut formed in the loops, or in some cases two cuts to form separate lines.

Figure 20:
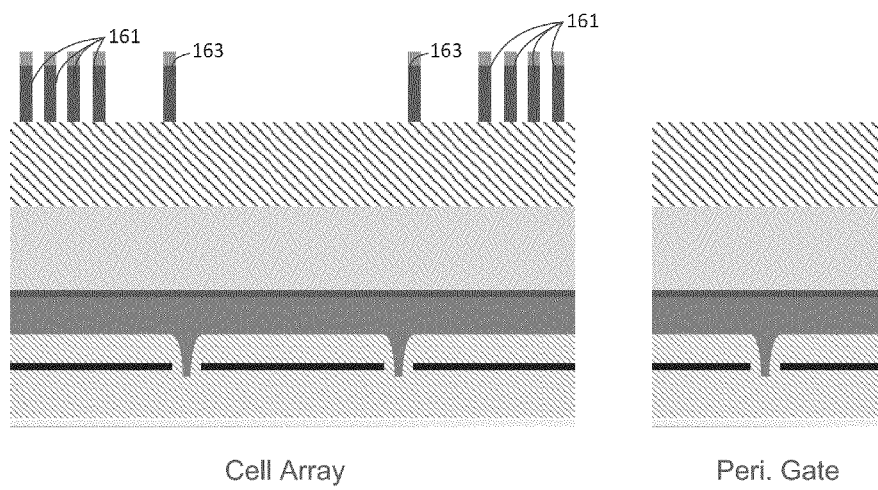

FIG. 20 shows the structure of FIG. 19 after the pattern of the sidewall spacers is transferred to the underlying SiN layer 123 to form structures 161 and 163 (some spacer material is shown remaining at this point).

Figure 21:
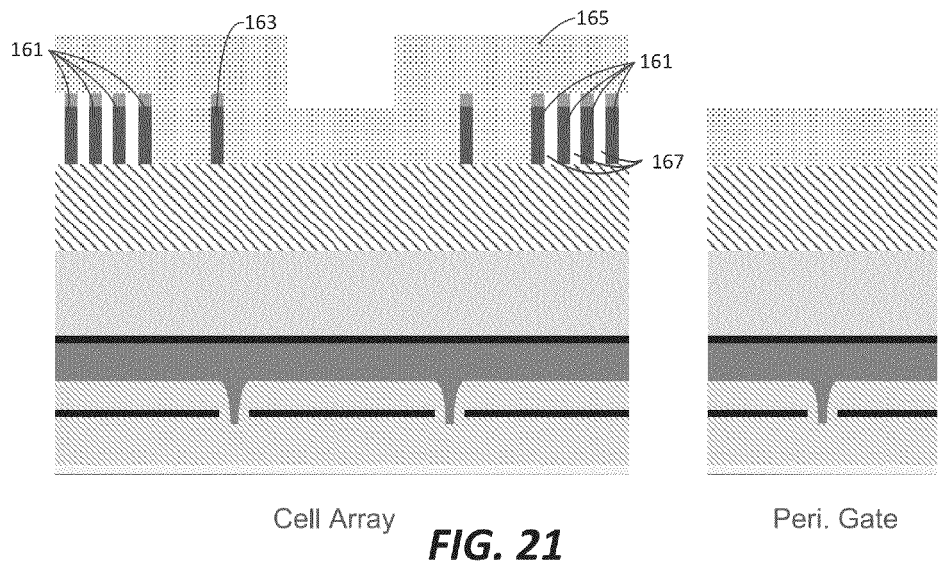

FIG. 21 shows the structure of FIG. 20 after deposition of an 80 nm thick airgap layer 165 (which may be any suitable material, e.g. SiO2 deposited using SiH4 or TEOS). Airgaps 167 are formed between SiN structures 161 because of the small gaps between such structures (F/2). However, the AG layer extends into larger gaps so that the AG layer establishes a central area where select gates will be formed, with this central area being different (no airgap), to the areas on either side where floating gate cells are to be formed (with airgaps between).

Figure 22:
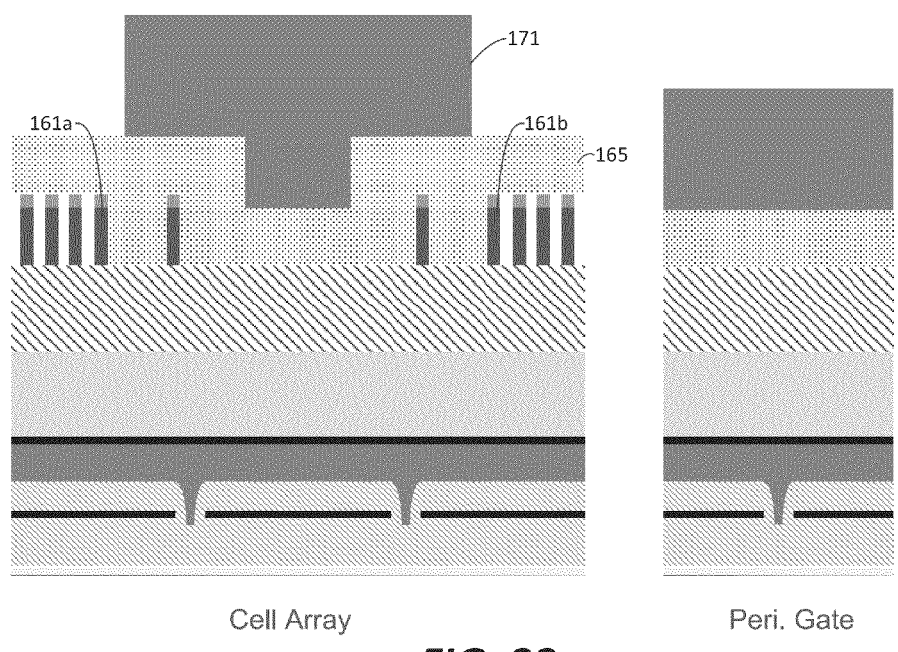

FIG. 22 shows the structure of FIG. 21 after a photoresist mask layer is formed and patterned (KG PEP) into mask portions to define select line structures. While the photoresist mask portion 171 shown largely defines the select gate structure, the exact perimeter of the structure is defined by SiN portions 161a, and 161b. This means that the spacing of the select line structure with respect to the word lines is not established by the KG PEP lithography, but is more precisely established by sidewall structures 161 which, as described above, have dimensions and spacing that is finer than the minimum feature size of the photolithographic process. The AG layer 165 and sidewall spacer provide a high tolerance for misalignment of the KG PEP pattern because it is the AG layer 165 in combination with the sidewall spacers 161 that primarily defines the perimeter of the select gate structure.

Figure 23:
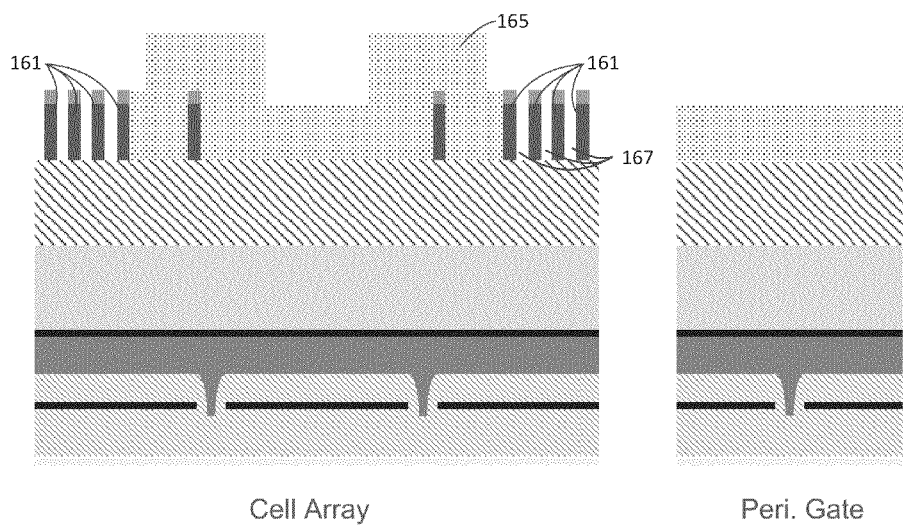

FIG. 23 shows the structure of FIG. 22 after etching the AG layer 165 using the KG PEP mask portion 171 and after subsequent removal of resist portion 171. In the present example, RIE and wet etching are used. This removes all AG material 165 where it overlies airgaps 167, thus opening the airgaps 167 to the ambient air. AG material remains in the central area where it was covered by photoresist, and remains up to the perimeter defined by SiN sidewalls 161.

Figure 24:
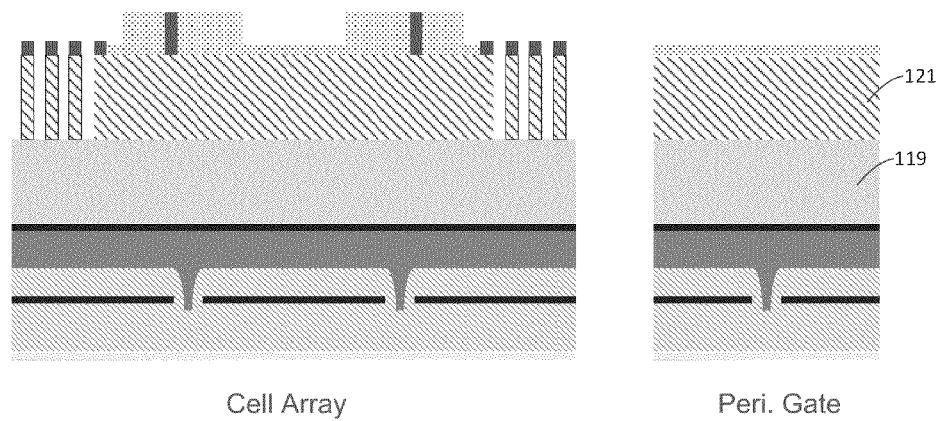

FIG. 24 shows the structure of FIG. 23 after transfer of the pattern to the underlying amorphous Silicon layer 121. This is achieved using an RIE etch.

Figure 25:
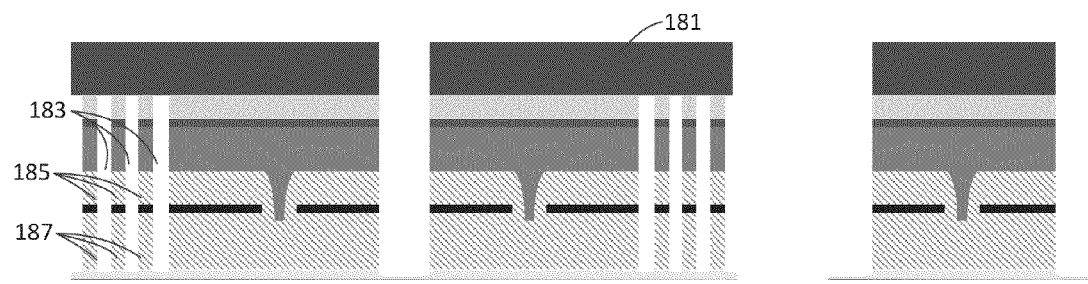

FIG. 25 shows the structure of FIG. 24 after an etch step to form word lines 185 (control gate, or "GC") in the pattern established in FIG. 24. Also shown is another airgap layer 181 that is formed over the entire pattern after formation of separate word lines 185 and floating gates 187. This covers airgaps 183 between adjacent word lines 185, and between their underlying floating gates 187. This reduces coupling between word lines and between floating gates.

Figure 26:
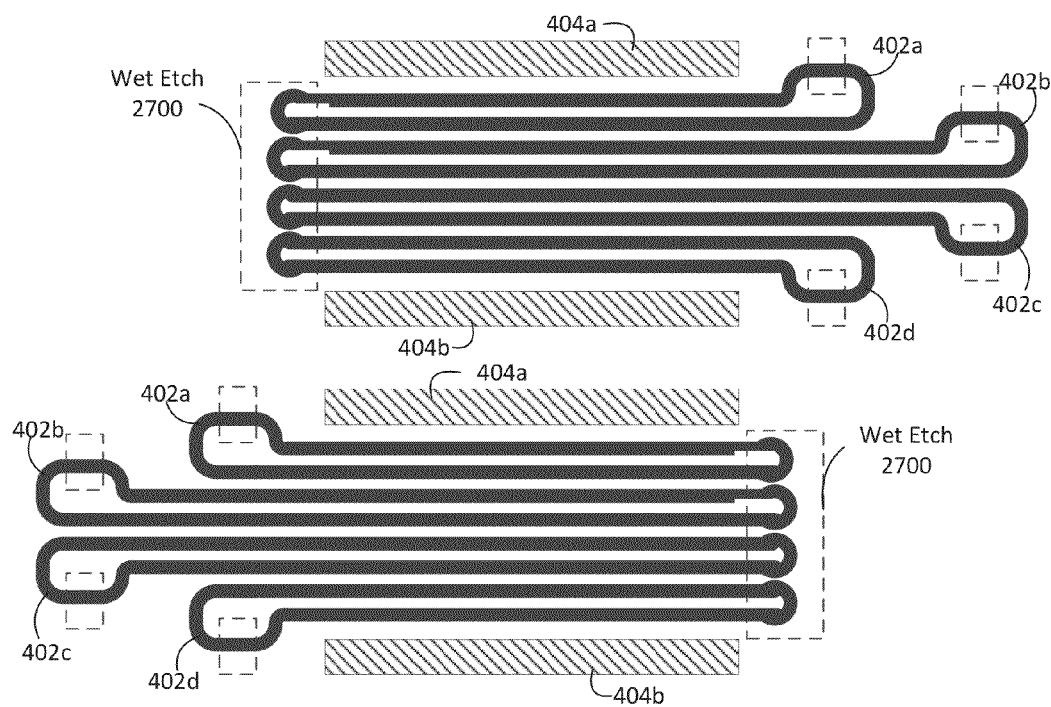

FIG. 26 shows a top-down view of a portion of a NAND flash memory array at an intermediate point of fabrication. Continuous closed loops of masking material 402a-402d extend laterally where word lines are to be formed. Portions of masking material 404a, 404b also extend laterally where select lines are to be formed. The view shown in FIG. 26 may correspond to the cross sections of FIG. 18, or 19, in which the masking material is SiO2. As previously mentioned, such loops of masking material may be cut at this point so that underlying conductive material is not patterned as continuous closed loops but instead forms separate word lines. The dashed lines of FIG. 26 indicate where such cutting may occur. As can be seen, on one side loops are closely spaced and all loops may be cut using a single opening. This opening is large, and alignment is not critical. In an example, cutting at this end is performed using a wet etch 2700 that is selective to etch SiO2 (while leaving underlying SiN substantially unetched). Thus, a patterning step (which may use relatively low resolution lithography) provides openings only at locations indicated as wet etch 2700 and a wet etch removes masking material (SiO2) in these areas without the potential problems of RIE, such as overetching or gouging. Cutting at the other end of loops, where contact pads are to be formed, may be achieved by the same wet etch, or may use a separate etch step.

Figure 27:
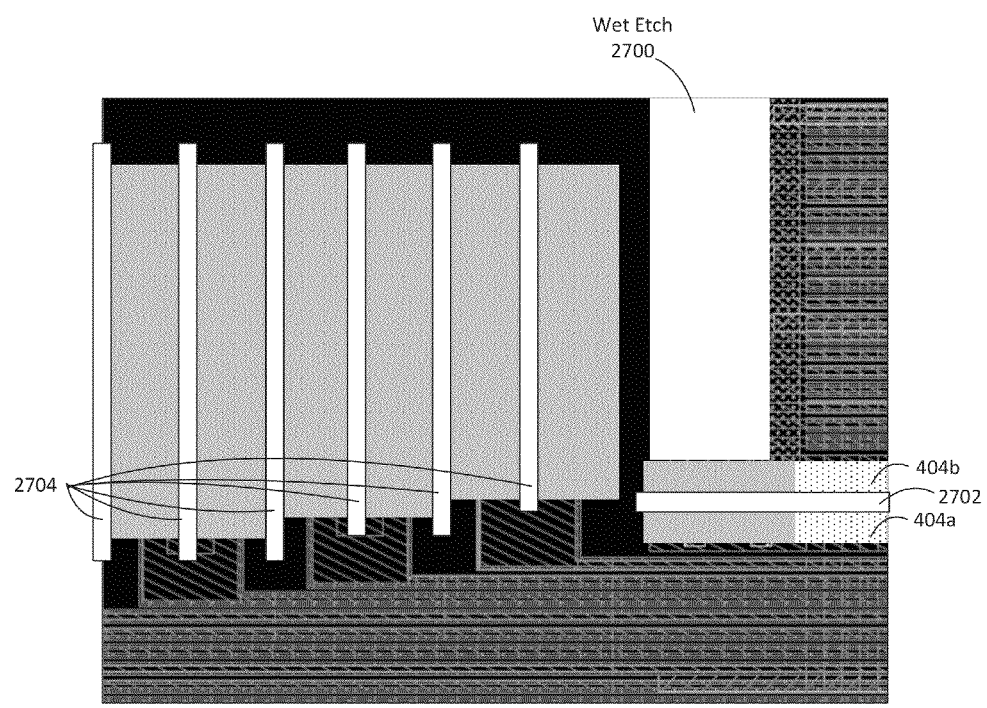

FIG. 27 shows an example of how cutting at contact pad end of the loops may be combined with an etch step that is used to separate a single select line structure into two select lines. Here an opening 2702 is used to separate a select line structure into separate select lines 404*a* and 404*b*. In the same etch step, openings 2704 are used to cut through loops of material to separate individual word lines at contact pad ends. Openings 2702 and 2704 may be formed by the same patterning process and etching through these openings may be performed together simultaneously, for example by RIE. Also shown in FIG. 27 is the area of wet etch 2700, which is separately patterned and exposed to etching in a separate etching step. In the example shown, cutting of contact pad ends of loops occurs after patterning to form contact pads so that individual contact pads are formed (separated from neighboring contact pads) in the same step that cuts conductive loops at the contact pad end.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of forming a NAND flash memory comprising:
   forming a plurality of structures using a photolithographic process;
   slimming the plurality of structures;
   forming a plurality of sidewall spacers having a lateral dimension that is less than the minimum resolvable dimension of the photolithographic process and forming an individual sidewall spacer enclosing an area used to define a select line, the plurality of sidewall spacers spaced apart a distance that is less than the minimum resolvable dimension of the photolithographic process and used to define word lines, the plurality of sidewall spacers and the individual sidewall spacer formed along sides of the plurality of structures;
   forming an air gap layer over the plurality of sidewall spacers and the individual spacer, wherein the air gap layer extends downwards into the area enclosed by the individual sidewall spacer and does not extend downwards between the plurality of the sidewall spacers used to used define the word lines, the air gap layer does not extend downwards between the individual sidewall spacer and the sidewall spacers used to define the word lines, the air gap layer overlies air gaps between the sidewall spacers used to define the word lines;
   removing a portion of the air gap layer over the plurality of the sidewall spacers, the individual sidewall spacer and the air gaps while leaving a portion of the air gap layer in the area enclosed by the individual sidewall spacer;
   forming a plurality of the word lines according to the plurality of sidewall spacers; and
   forming the select line such that at least one edge of the select line is defined by the individual sidewall spacer that is spaced apart from its closest neighbor a distance that is less than the minimum resolvable dimension of the photolithographic process.

2. The method of claim 1 wherein dimensions of the area exceed the minimum resolvable dimension of the photolithographic process.

3. The method of claim 1 wherein the lateral dimension of the sidewall spacers is half the minimum resolvable dimension of the photolithographic process and sidewall spacers used to form word lines are spaced apart a distance that is half the minimum resolvable dimension of the photolithographic process.

4. A method of forming a NAND flash memory array comprising:
   forming a plurality of structures using a photolithographic process;
   subsequently, slimming the plurality of structures so that at least one dimension of the plurality of structures is less than the minimum resolvable dimension of the photolithographic process;
   subsequently, forming a plurality of sidewall spacers defined by the slimmed plurality of structures, the sidewall spacers having a lateral dimension that is less than the minimum resolvable dimension of the photolithographic process;
   subsequently, forming an air gap layer, the air gap layer overlying air gaps between first sidewall spacers in word line areas and the air gap layer extending between second sidewall spacers in select line areas in select line areas;
   subsequently, etching back the air gap layer to remove the air gap layer over the first sidewall spacers and the air gaps while leaving at least a portion of the air gap layer between the second sidewall spacers;
   subsequently, forming word lines defined by the first sidewall spacers; and
   forming select lines with edges defined by the second sidewall spacers.

5. The method of claim 4 wherein the sidewall spacers are formed of Silicon Nitride.

6. The method of claim 4 wherein the air gap layer is formed of Silicon dioxide using Silane (SiH4).

7. The method of claim 6 further comprising forming a layer of Silicon Nitride on the air gap layer.

8. The method of claim 7 further comprising etching back the layer of Silicon Nitride with the air gap layer such that portions of the Silicon Nitride layer remain in the select line areas.

* * * * *